United States Patent [19]

Wakai et al.

[11] Patent Number: 4,477,747
[45] Date of Patent: Oct. 16, 1984

[54] LAMP CIRCUIT FOR AUTOMOBILE

[75] Inventors: Kiyoshi Wakai; Toshirou Shimodaira; Yoneharu Fukushima, all of Nagano, Japan

[73] Assignee: Kabushiki Kaisha Sankyo Seiki Seisakusho, Nagano, Japan

[21] Appl. No.: 423,780

[22] Filed: Sep. 27, 1982

[30] Foreign Application Priority Data

Oct. 3, 1981 [JP] Japan ................................ 56-157957

[51] Int. Cl.³ ............................................ H05B 37/00
[52] U.S. Cl. ............................. 315/200 A; 315/200 R
[58] Field of Search ........................ 315/200 A, 200 R

[56] References Cited

U.S. PATENT DOCUMENTS 3,660,674  5/1972  Bolinger ................... 315/200 A X
3,663,860  5/1972  Phillips ...................... 315/225 X
3,858,088  12/1974  Scarpino et al. .............. 315/200 A Primary Examiner—David K. Moore
Attorney, Agent, or Firm—Sughrue, Mion, Zinn, Macpeak and Seas

[57] ABSTRACT

A flashing lamp circuit, having a first transistor in circuit with a lamp and power supply, provides intermittent flashing by intermittently turning the transistor on and off in response to an on-off input signal. The transistor is protected against surge currents when the lamp short-circuits by monitoring the lamp voltage and turning the first transistor off when the lamp voltage drops below a predetermined amount for a given period during which the on-off signal is on.

10 Claims, 4 Drawing Figures

← LAMP IS NOT SHORT-CIRCUITED → ← LAMP IS SHORT-CIRCUIT →

LAMP CIRCUIT FOR AUTOMOBILE

BACKGROUND OF THE INVENTION

The present invention is directed to a lamp circuit for an automobile, wherein a transistor provided in a circuit between a power source and the lamp is protected against excessive current when the lamp is short-circuited.

In a lamp circuit of the type having a transistor between the power source and the lamp for intermittently permitting a current to flow through the latter, a short-circuit detector circuit is usually provided to prevent the transistor from being destroyed by a large current when the lamp is short-circuited.

A conventional short-circuit detector detects the short-circuit of the lamp by detecting a variation in the current flowing through a resistor connected in series with the lamp. Due to the voltage drop across the resistor, the voltage applied across the lamp is reduced.

Another conventional short-circuit detector circuit utilizes a resistor connected in parallel with the transistor. However since current flows through the resistor continuously, there is a relatively large current loss.

SUMMARY OF THE INVENTION

In accordance with the present invention a circuit is provided which overcomes the defects of the conventional short-circuit detector. One object of the present invention is to provide a lamp circuit having low voltage and current losses.

The lamp circuit according to the present invention includes basically a first transistor provided in a circuit between a power source and a lamp for switching on and off a current flowing through the circuit, a second transistor reponsive to a lamp on-off signal for controlling the first transistor, and a third transistor constituting a portion of a short-circuit detector for the lamp, the third transistor being responsive to the lamp on-off signal and the short-circuit detection for controlling the second transistor.

DESCRIPTION OF PREFERRED EMBODIMENTS

Figure 1:
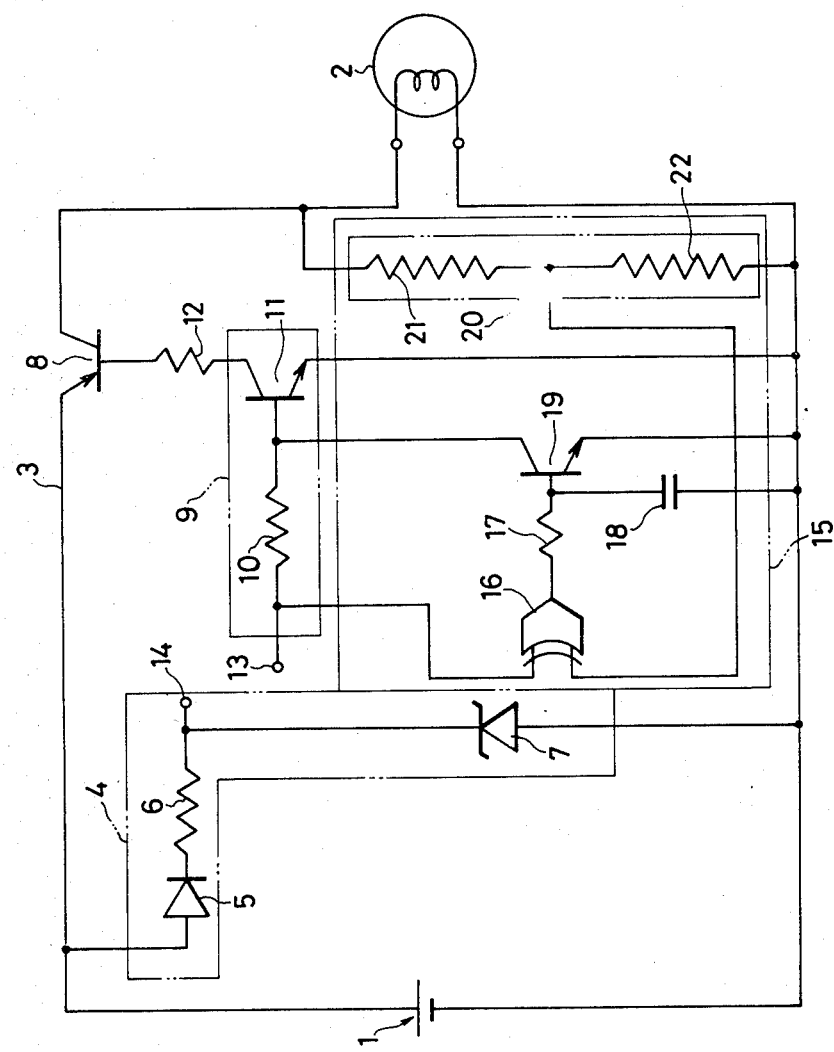
FIG. 1 is a circuit diagram of a first embodiment of the present invention.

The present invention will be described in detail with reference to the embodiments shown in the drawings, wherein corresponding components are depicted by the same reference numerals throughout.

In FIG. 1, which shows a first embodiment of the present invention, a d.c. power source 1 is connected through a circuit 3 to a lamp 2. A PNP transistor 8, inserted in the circuit 3, has its emitter and collector terminals connected to the positive side of power source 1 and the high voltage side of lamp 2, respectively. A constant voltage circuit, indicated by broken line 4, is connected in parallel with the power source 1. The constant voltage circuit 4 is composed of a series circuit of a rectifying diode 5, a resistor 6 and a Zener diode 7.

A control circuit, shown by broken line 9, is connected through a resistor 12 to the base of transistor 8. The control circuit 9 is composed of a resistor 10 and a second transistor 11; the latter being NPN transistor. The collector of transistor 11 is connected through the resistor 12 to the base of transistor 8. The emitter and base of transistor 11 are connected to the negative side of the d.c. power source 1 and an input terminal 13 for receiving a lamp on-off signal through the resistor 10, respectively. The input terminal 13 is to be connected through an on-off switch mechanism (not shown) to a VDD terminal 14, which constitutes a portion of the constant voltage circuit 4. The on-off switch mechanism is provided to intermittenly connect the input terminal 13 and the VDD terminal 14.

A short-circuit detector circuit, shown by broken line 15, includes an exclusive OR circuit 16, a resistor 17, a capacitor 18, a third transistor 19 and a volage divider circuit 20, comprising a series circuit of resistors 21 and 22. The voltage divider 20 is connected in parallel with the lamp 2. One input terminal of exclusive OR circuit 16 is connected to input terminal 13, and the other input to exclusive OR circuit is connected to the junction between resistors 21 and 22. The output of exclusive OR circuit 16 is connected through resistor 17 to the base of transistor 19.

Capacitor 18 of short-circuit detector 15 has a high voltage side electrode connected to the base of transistor 19 and a low voltage side electrode connected to the negative side of power source 1, and constitutes, together with the resistor 17, a charging circuit.

Transistor 19 is, in this case, an NPN transistor whose collector is connected to the base of transistor 11 and emitter is connected to the negative side of power source 1.

The capacitor 18 functions to control the on and off states of transistor 19. The time constant of the RC circuit including resistor 17 and capacitor 18 is selected such that transistor 19 is not turned on by a flash current at a time when the lamp is lighted.

Transistor 8 should be large enough to withstand a large current flowing therethrough during a time period determined by the RC time constant.

Operation of the lamp circuit will be described with reference to a time chart shown in FIG. 4.

Figure 4A:
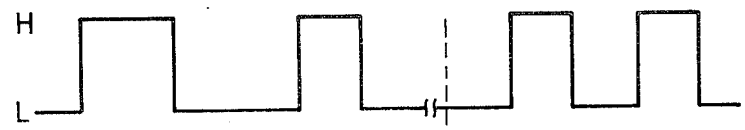
FIG. 4 is a waveform diagram for explaining the operation of the first embodiment.

Assuming that lamp 2 is not short-circuited and the voltage at the VDD terminal 14 is not applied to the input terminal 13, i.e., the terminals 13 and 14 are not connected to each other, the voltage at the input terminal 13 is in a low level L as shown in FIG. 4a and the second transistor 11 and hence the transistor 8 are in there off states. Therefore, the voltage at the high voltage side of the lamp 2 is also in a low level L shown in FIG. 4c. At this time since both input terminals of the exclusive OR circuit 16 are at the level L, the output terminal thereof is also in the L state, causing the capacitor 18 to be in a non-charging state.

Figure 4B:
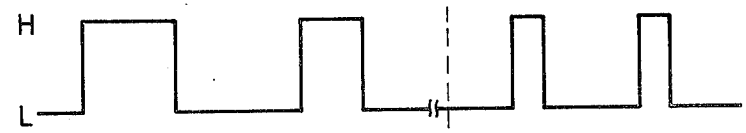
Figure 4C:
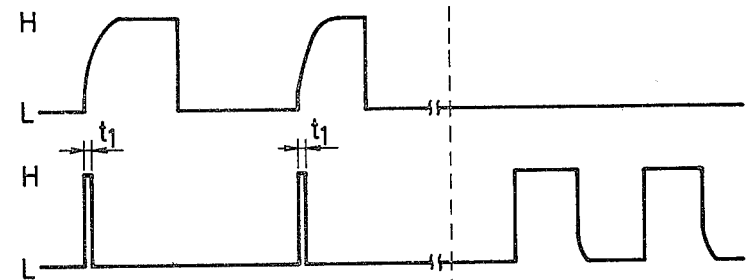
Figure 4D:
Figure 4E:
Figure 4F:
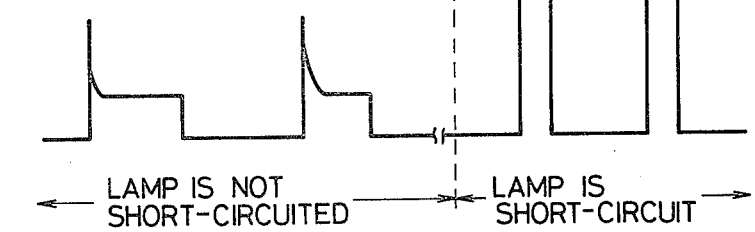

When the voltage at VDD terminal 14 is applied to input terminal 13, that voltage is supplied to transistor 11 and exclusive OR circuit 16 as the on-off signal for the lamp 2. That is, when the potential at the input terminal 13 is switched from the low level L to a high level H state, the base potential of the second transistor 11 is changed from the L to the H state turning the second transistor 11 to the on state, as shown in FIG. 4b, upon which the first transistor 8 is turned on, causing the lamp to be lighted by a current flowing through the transistor 8. The current flowing through transistor 8 includes a spike or flash current at an initial portion thereof as shown in FIG. 4f, and therefore the voltage at the high potential side of the lamp is not saturated until a constant time $t_1$ lapses as shown in FIG. 4c. Hereupon, the exclusive OR circuit 16 supplies an output at the time that potentials of the inputs thereof are different from each other. Therefore, the exclusive OR circuit 16 provides an output for only the constant time duration $t_1$ as shown in FIG. 4d, and the output therefrom is supplied to the base of transistor 19. At this time, since the time constant of the charging circuit is set such that the voltage across the capacitor 18 does not exceed the base-emitter turn-on potential of transistor 19 during the time period $t_1$, the charging voltage therefore is small as shown in FIG. 4e and thus the third transistor 19 is maintained in the off state. Lamp 2 therefore remains on unless the voltage at input terminal 13 drops to the L state.

When the lamp 2 is short-circuited and the input terminal 13 is in the L state, there is no current through the lamp. However, when the input terminal 13 is in the H state, as shown in FIG. 4a, and thus the signal is applied to the base of the second transistor 11, the latter is turned on and hence the first transistor 8 is turned on, causing a current to flow through the lamp. However, since the lamp 2 is short-circuited, the current becomes too large as shown in FIG. 4f.

On the other hand, since the high potential side of the lamp 2 is in the L state as shown in FIG. 4c, when the lamp 2 is short-circuited, an L potential is applied to the other input of exclusive OR circuit 16, whose one input has been an H potential. Therefore, the OR circuit 16 provides an output to the base of transistor 19. After a constant time $t_2$ determined by the time constant of the charging circuit, the voltage on capacitor 18 exceeds the base-emitter turn on potential of the third transistor 19, turning the latter on. This causes transistors 11 and 8 to turn off and interrupt the current flowing through lamp 2.

Figure 2:
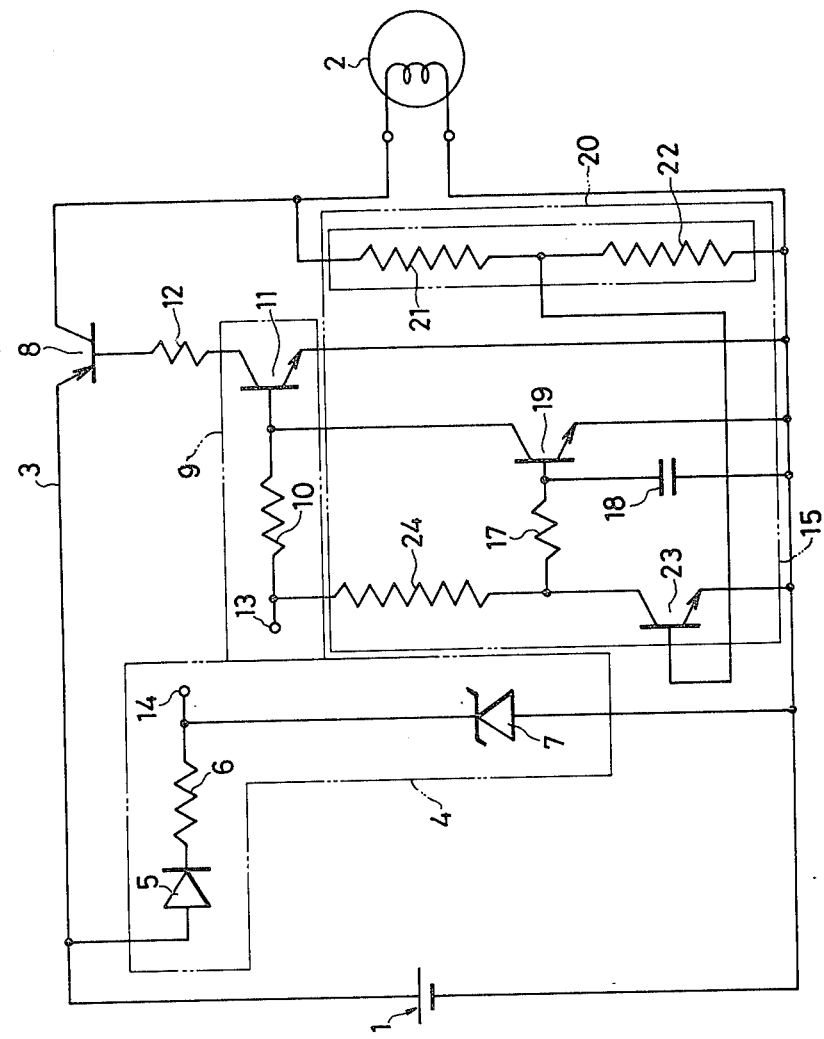
FIG. 2 is a circuit diagram of a second embodiment of the present invention.

FIG. 2 shows another embodiment of the invention in which a series circuit of a transistor 23 and a resistor 24 is used instead of the exclusive OR circuit 16 of the first embodiment. In the second embodiment, transistor 24 is of the NPN type and has its collector connected through the resistor 24 to input 13, its emitter connected to the negative side of a d.c. source 1, and its base connected to voltage divider 20.

With the second embodiment, it is possible to use a small and inexpensive transistor as the transistor 23 and since the detector level is generally small compared with that of the exclusive OR circuit 16, it is possible to make the time constant of the charging circuit small.

Figure 3:
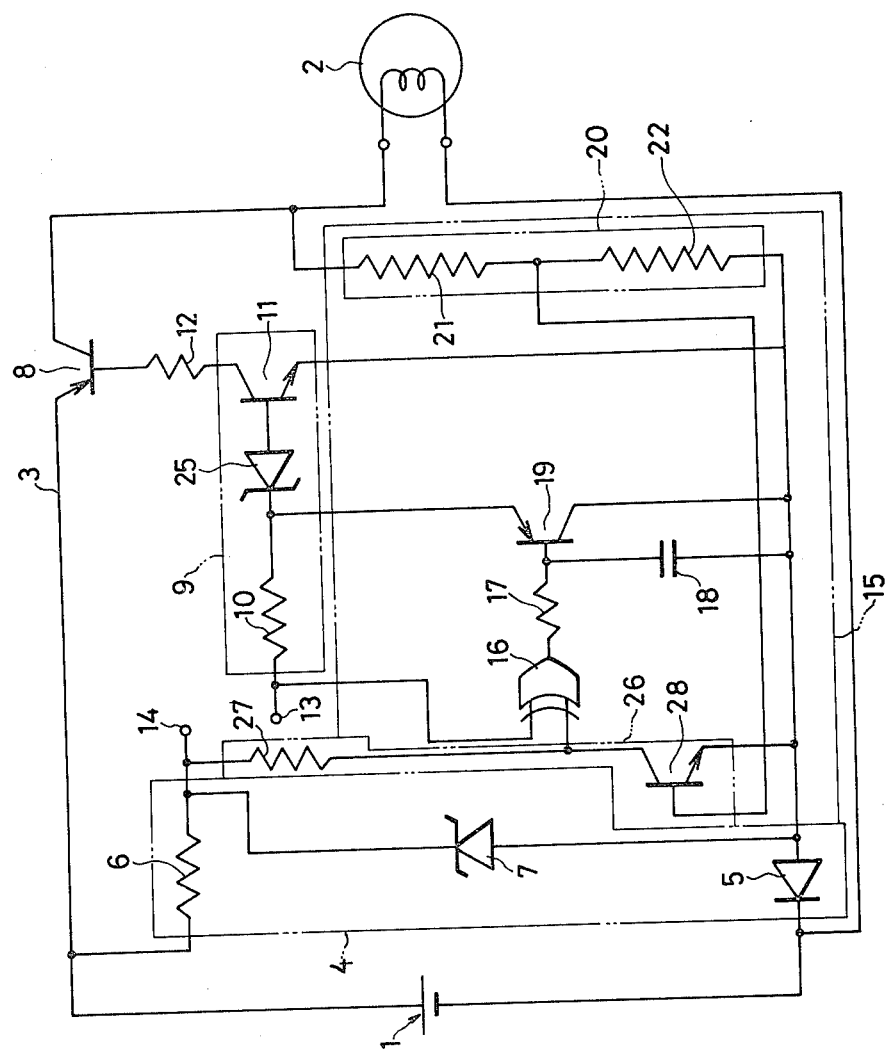
FIG. 3 is a circuit diagram of a third embodiment of the present invention.

FIG. 3 shows a third embodiment of the invention. In this embodiment, a voltage drop in a wire harness portion is considered.

The lamp 2 is connected through the circuit 3 to d.c. source 1. A constant voltage circuit 4, consists of a series circuit of a resistor 6 and a Zener diode 7 and a rectifying diode 5. One end of the resistor 6 is connected to the positive side of d.c. source 1, and the cathode of diode 5 is connected to the negative side of d.c. source 1. The first transistor 8 is provided in the circuit 3 as in the first embodiment. A control circuit 9 includes resistor 10, a Zener diode 25 and second transistor 11. The cathode of diode 25 is connected to one end of resistor 10 and the anode thereof connected to the base of transistor 11.

The short-circuit detection circuit 15 consists of exclusive OR circuit 16, resistor 17, capacitor 18, third transistor 19, voltage divider 20 and a switching circuit 26. The high potential side of voltage divider 20 is connected to the high potential side of lamp 2 and the low potential side of voltage divider 20 is connected to the anode of the diode 5. The third transistor 19 is of the PNP type and has its emitter connected to the cathode of Zener diode 25 and its collector connected to the anode of diode 5. The switching circuit 26 consists of a resistor 27 and transistor 28 and is connected in parallel with Zener diode 7. The transistor 28 is of the NPN type and has its collector connected to one end of the resistor 27, its emitter connected to the anode of diode 5, and its base connected to the voltage divider 20. One of the two inputs of the exclusive OR circuit 16 is connected to the input terminal 13, and the other input is connected to the collector of transistor 28.

The emitter of transistor 11 and the low potential side of capacitor 18 are connected to the anode of diode 5.

In the latter embodiment, since it is possible to make the detection level of the transistor 28 higher by means of the rectifying diode 5, a malfunction of the short-circuit detector 15 due to a large current flowing through the wire harness, etc., can be prevented.

As described hereinbefore, according to the present invention, the voltage variation in the circuit between the first transistor and the lamp is detected, it is possible to provide a lamp circuit for an automobile whose voltage loss and/or current loss is minimized.

What is claimed:

1. A lamp circuit comprising:
   (a) a lamp,
   (b) a source of power,
   (c) a first transistor connected in series with said lamp and source of power for providing current to said lamp when said transistor is in the conducting state,
   (d) intermittent on-off control means responsive to an on-off input signal and connected to an input electrode of said first transistor for intermittenly turning on and off said first transistor, and
   (e) short circuit detector means for turning off said first transistor when a short circuit occurs in said lamp, said short circuit detector means comprising:
      (i) voltage detection means connected in parallel across said lamp for detecting voltage variations in said lamp,
      (ii) switch means connected to said intermittent on-off control means for forcing said latter means to an off condition, thereby forcing off said first transistor, when said switch means is activated,
      (iii) switch control means for controlling said switch means so as not to activate said switch means for a predetermined period of time after said first transistor is turned on, connected to said switch means, said voltage detection means, and said intermittent on-off control means, for providing a control signal under the condition that said on-off input signal is on and said voltage detection means detects a lamp voltage below a predetermined minimum.

2. A lamp circuit as claimed in claim 1, wherein said switch control means comprises, control signal producing means connected to said voltage detection means and said intermittent on-off control means, and time constant circuit means connected to said control signal producing means and said switch means, and responsive to said control signal for activating said switch means when said control signal exists for a predetermined time.

3. A lamp circuit as claimed in claim 2 wherein said time constant circuit has a sufficiently long time constant to prevent activation of said switch means during the period between initiation of said on signal and stabilization of the voltage in said lamp when there is no short circuit in said lamp.

4. A lamp circuit as claimed in claim 3 wherein said intermittent on-off control means comprises a second transistor having an input terminal connected to receive said on-off signal and an output terminal connected to an input terminal of said first transistor, whereby said on-off signal controls the state of said second transistor, which in turn controls the state of said first transistor.

5. A lamp circuit as claimed in claim 4 wherein said switch means comprises a third transistor having on output terminal connected to the input of said second transistor, whereby said third transistor, when in an active state, overrides the application of an on signal to said second transistor.

6. A lamp circuit as claimed in claim 5 wherein said time constant circuit is an RC circuit and is connected to the input terminal of said third transistor.

7. A lamp circuit as claimed in claim 5 wherein said control signal producing means, comprises an exclusive OR circuit having one input connected to receive said on-off signal and a second input connected to receive the output of said voltage detection means.

8. A lamp circuit as claimed in claim 5 wherein said control signal producing means comprises a series circuit of a resistor and a fourth transistor connected between said intermittent on-off control means and a point of reference potential, said transistor input terminal being connected to receive the output from said voltage detection means, and the junction between said resistor and fourth transistor being connected to said time constant circuit, whereby said on signal is applied to said time constant circuit when said on signal is present and the voltage detection means detects a lower than predetermined lamp voltage, and said reference potential is applied to said time constant circuit at all other times.

9. A lamp circuit as claimed in claim 5 wherein said control signal producing means comprises, a series circuit comprising a resistor and a fourth transistor connected in series between reference potential points, said series circuit providing an output at the junction of said resistor and said fourth transistor, said fourth transistor having an input terminal connected to the output of said voltage detection means, and an exclusive OR circuit having a first input connected to receive said on-off input signal, a second input connected to the output of said series circuit, and an output connected to said time constant circuit.

10. A lamp circuit as claimed in claim 7, 8, or 9 wherein said voltage detection means comprises a voltage divider connected in parallel with said lamp.

* * * * *